United States Patent [19]

Dixon, III

[11] E Re. 29,181

[45] Reissued Apr. 12, 1977

[54] METHOD OF PREPARING PRINTED CIRCUIT BOARDS WITH TERMINAL TABS

[75] Inventor: Charles H. Dixon, III, Waukesha, Wis.

[73] Assignee: RBP Chemical Corporation, Milwaukee, Wis.

[22] Filed: June 4, 1976

[21] Appl. No.: 693,053

Related U.S. Patent Documents

Reissue of:

[64] Patent No.: 3,926,699
Issued: Dec. 16, 1975
Appl. No.: 534,034
Filed: Dec. 18, 1974

U.S. Applications:

[60] Continuation-in-part of Ser. No. 479,705, June 17, 1974, abandoned, which is a division of Ser. No. 322,040, Jan. 8, 1973, Pat. No. 3,841,905, which is a continuation-in-part of Ser. No. 90,908, Nov. 19, 1970, abandoned.

[52] U.S. Cl. ..... 156/656; 156/659; 156/666; 252/79.3; 427/96; 427/328

[51] Int. Cl.[2] ..... C23F 1/02

[58] Field of Search ..... 252/79.1, 79.3, 79.4; 75/97 R, 97 A; 156/3, 8, 11, 13, 18; 134/3, 41; 174/68.5; 29/625; 427/96, 98, 99, 287, 328

[56] References Cited

UNITED STATES PATENTS

| | | | |
|---|---|---|---|
| 3,158,517 | 11/1964 | Schwarzenberger | 252/79.3 X |
| 3,537,926 | 11/1970 | Fischer | 252/79.3 |
| 3,615,950 | 10/1971 | Lacal | 156/3 |
| 3,677,949 | 7/1972 | Brindisi et al. | 156/18 X |

*Primary Examiner*—William A. Powell
*Attorney, Agent, or Firm*—Wheeler, Morsell, House & Fuller

[57] ABSTRACT

A method for rapidly stripping solder or tin from a substrate, such as copper, without adversely affecting the substrate in the preparation of circuit boards having terminal tabs. The composition comprises hydrofluoric acid or salts thereof, ammonia and an oxygen source such as hydrogen peroxide. The use of a soluble metal complexer peroxide stabilizer enables use of larger percentages of fluoride and peroxide to materially increase the life and capacity of the product. The composition is especially useful in a process of rapidly stripping solder from copper terminal tabs of a printed circuit board, following which the exposed copper tab is plated with a more noble metal.

7 Claims, 7 Drawing Figures

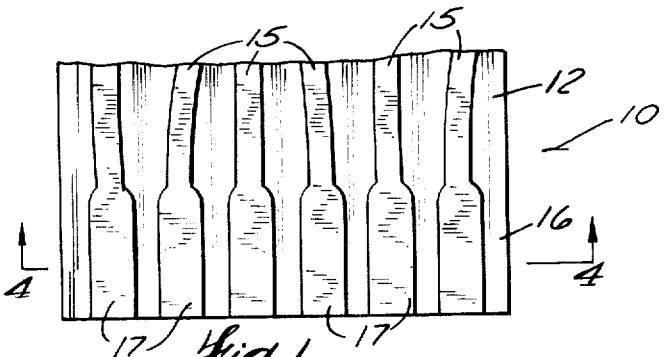
Fig. 1
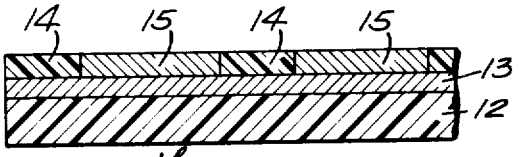
Fig. 2
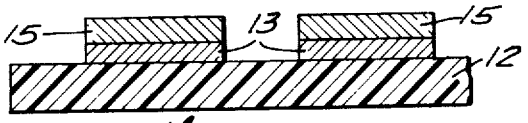
Fig. 3
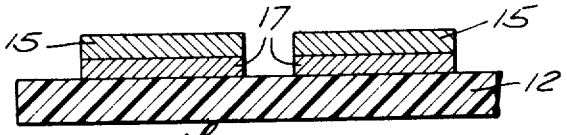
Fig. 4
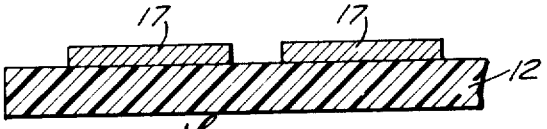
Fig. 5
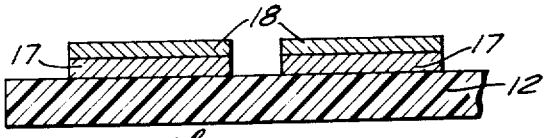
Fig. 6
Fig. 7
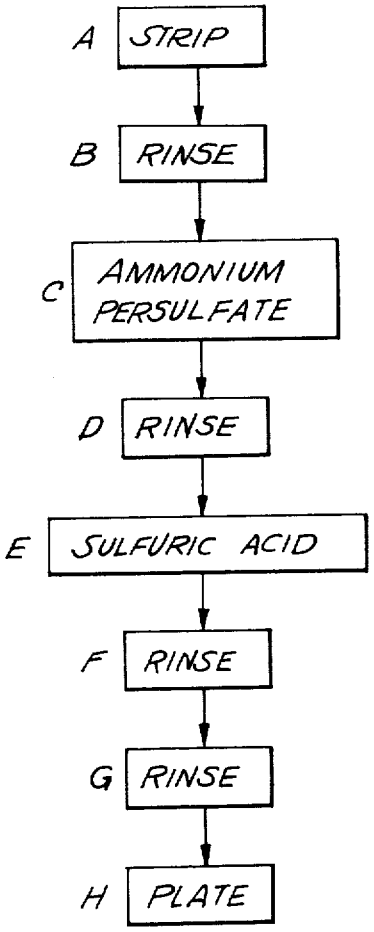

METHOD OF PREPARING PRINTED CIRCUIT BOARDS WITH TERMINAL TABS

Matter enclosed in heavy brackets [ ] appears in the original patent but forms no part of this reissue specification; matter printed in italics indicates the additions made by reissue.

CROSS REFERENCE TO RELATED APPLICATION

This application is a continuation-in-part application of Ser. No. 479,705, filed June 17, 1974, now abandoned, which is a division of application Ser. No. 322,040, filed Jan. 8, 1973, now U.S. Pat. No. 3,841,905, *which is a continuation-in-part of application Ser. No. 90,908, filed Nov. 19, 1970, now abandoned.*

BACKGROUND OF THE INVENTION

Various compositions including acids have previously been used to strip solder from a copper substrate. However, in the use of such prior available compositions, the workpiece must be exposed to the composition for a relatively long period of time to effectively strip the solder. Within this relatively long period the stripping composition can adversely affect the copper substrate.

SUMMARY OF THE INVENTION

The present invention is characterized by the unique coaction of ammonia with hydrofluoric acid or salts thereof in selectively attacking solder or tin plated to a substrate of copper or plastic in preparation of circuit boards having terminal tabs used for connection with other or ancillary circuits or circuit components. The ammonia does not inhibit the rapid attack of the hydrofluoric acid on the solder but does inhibit, moderate or throttle the rate of attack of the acid on the copper and plastic or fiberglass substrate. The ammonia appears to function as a negative or anti-catalyst in the reaction rate of the acid on the copper or plastic. However, the reaction rate of the acid on the solder or tin is extremely fast. Typical exposures of the composition to the solder in the time range of 0.5 to 3 minutes will completely remove the solder. Within this exposure time range the ammonia appears to inhibit any material adverse reaction of the acid on the copper or fiberglass board.

Following this brief exposure, the workpiece is flushed to remove the composition and dissolved solder and the copper may then be subsequently treated by conventional techniques, for example, plating with a more noble metal.

One specific use of the invention is in the fabrication of printed circuit boards in which the terminal tabs of the board must be stripped of solder or tin before plating with a more noble metal.

In U.S. Pat. No. , 3,841,905, preferred and operative ranges are disclosed for ammonium bifluoride and hydrogen peroxide. Although the operative ranges accomplish the intended result, if the preferred ranges are exceeded, certain undesirable effects can occur such as severe copper attack and attack on the board. I have found that good results are obtained in the operative range and beyond the preferred range if a hydrogen peroxide stabilizer and/or a soluble metal complexer is used. With a stabilizer and the use of ammonium bifluoride in excess of 25% and hydrogen peroxide in excess of 5%, substantially longer product life and capacity is experienced than with a product having bifluoride less than 25% and peroxide less than 5%.

Other objects, features, and advantages of the invention will appear from the following disclosure.

DESCRIPTION OF THE DRAWINGS

FIG. 1 is a plan view of a printed circuit board.

FIGS. 2 and 3 are typical cross sections through the board of FIG. 1 in the course of successive steps in the fabrication of the board.

FIG. 4 is a cross section taken along the line 4—4 of FIG. 1 at an intermediate stage in the fabrication of the board.

FIG. 5 is a cross section similar to FIG. 2, but showing the condition of the board after the solder has been stripped from the copper.

FIG. 6 is a cross section similar to FIG. 3, but showing the condition of the board after the plating of the copper with a more noble metal.

FIG. 7 is a flow chart illustrating various steps in a typical treatment of the circuit board following application of the method of the invention.

DESCRIPTION OF THE PREFERRED EMBODIMENTS

Although the disclosure hereof is detailed and exact to enable those skilled in the art to practice the invention, the physical embodiments herein disclosed merely exemplify the invention which may be embodied in other specific structure. The scope of the invention is defined in the claims appended hereto.

While the invention has other uses, it will be described herein primarily in connection with its application to the fabrication of a printed electric circuit board 10 which has terminal tabs 17 to which connections between the circuit and other circuits are made. In the fabrication of the workpiece or board 10 a copper foil sheet 13 (FIG. 2) is laminated to a base board 12. The base board 12 is typically an epoxy glass such as NEMA type G-10 and has the designation of type GE in MIL-P-13949 D. This grade is a glass-base material with a continuous-filament glass cloth with an epoxy-resin binder. Another common circuit board material is the flame-retardant epoxy glass which is classified as NEMA type FR-4 and Type FG in MIL-P-13949D. This latter grade is a glass base with a flame-retardant epoxy resin. Boards formed from polyester resins are also in use with and without fiberglass. As used in the claims, plastic resin boards includes phenolic, polyester and epoxy resin boards with and without fiberglass.

Over the copper foil 13 a photo-resist layer 14 is applied. The printed circuit is created in part by depositing through the resist layer 14 a network pattern of solder lines 15. The solder may comprise any conventional tin-lead alloy. In the printed-circuit industry the most common alloys are the tin-lead alloys in the eutectic range of 63:37 and 60:40 as well as low-tin alloys of 40:60 used for economy. In addition to the use of solder in fabricating printed circuit boards, bright tin, plated in accordance with the disclosure in U.S. Pat. No. 3,361,562, has become popular. The network pattern 15 penetrates the resist layer 14 and adheres to the copper foil 13.

After the network pattern is deposited the photoresist layer 14 is stripped, as with a commercial solvent, thus leaving the copper foil 13 exposed, but having over its surface a mask of solder in the network pattern. A copper etching solution is then applied to the board to etch away all the copper except that portion of the copper which is masked by the solder network pattern. This leaves the board in a typical state as shown in FIG. 3 in which the circuit comprises lines of copper 13 over which complementary lines of solder 15 are plated.

The circuit portion of the board remains in its condition shown in FIG. 3 during subsequent use of the board. However, the connecting tab portion 16 of the board undergoes further fabricating steps before ultimate use. In order to prepare the copper tabs 17 for use as terminals to interconnect one board to another, the solder must be stripped from the copper tabs 17 and the copper tabs 17 are then plated with a more noble metal which is corrosion and/or wear resistant, such as gold, nickel, or rhodium, to condition the tabs to function as connector elements.

The problem at this point in board fabrications is to remove or strip the solder 15 from the copper tabs 17 without adversely affecting the copper or the board 12 and to preserve the copper in optimum condition to receive the plating of the more noble metal. While solder stripping compositions have heretofore been commercially used, they usually require a long time exposure (15 minutes or more) to strip the solder and these compositions also attack the copper substrate, thus requiring further treatment of the copper substrate to restore it to an acceptable condition to receive the plating of the noble metal.

The composition of the present invention has an extremely rapid action on the solder, thus to strip it completely within a short period of time (about 0.5 to 3 minutes) and has no adverse effect within this time period upon the copper substrate on the board 12.

The composition of the present invention which achieves these improved results is based upon the discovery that the combination of ammonia with hydrofluoric acid will leave the hydrofluoric acid highly reactive on the solder, but will inhibit or throttle the action of the hydrofluoric acid on the copper. Within the short period of time required to completely strip the solder there is no material or adverse reaction of the acid on the copper substrate.

The stripping composition of the present invention comprises in a preferred embodiment an aqueous solution of ammonium bifluoride and hydrogen peroxide. The preferred and operative ranges of the foregoing ingredients (by weight at room temperature) are as follows:

| Ingredient | Preferred Range | Operative Range |
|---|---|---|
| Ammonium bifluoride | 10%–25% | 0.5%–50% |
| Hydrogen peroxide | 1%–5% | 0.5%–35% |
| the balance being water | | |

Ammonium bifluoride is a preferred salt of hydrofluoric acid. However, the invention is not limited to this specific salt, as any reactive composition of ammonia and hydrofluoric acid or salts thereof will free the hydrofluoric acid to attack the solder and will free the ammonia to throttle the attack of the acid on the copper. For example, a mixture of ammonium halides with hydrofluoric acid is satisfactory.

The hydrogen peroxide is merely an example of a convenient oxygen source needed to support the reaction of the acid on the solder. Other suitable oxygen sources can be substituted. Examples are tert-butyl hydro-peroxide and sodium or ammonium perborate.

The ammonia does not appear to function to produce desired results with acids other than hydrofluoric. For example, if hydrochloric acid is used in place of hydrofluoric acid, the solder will be stripped but the ammonia does not inhibit the action of the hydrochloric acid on the copper substrate which is adversely affected by the hydrochloric acid.

The preferred ranges of ammonium bifluoride and hydrogen peroxide set forth above provide good results with a minimum of attack on the copper and the board 12. However, it has been found that the advantages of the invention and good commercial results can also be obtained with a minimum of side effects if the ammonium bifluoride is in the range of 5%–50% and the hydrogen peroxide is in the range of 1%–35%. As the hydrogen peroxide is increased beyond 5% it has been found that the use of a peroxide stabilizer will inhibit decomposition of the peroxide and release of oxygen. In addition, the use of the peroxide stabilizer prevents severe attack on the copper and board.

The increase in bifluoride and peroxide above the limits set forth in the preferred ranges using a stabilizer results in a product with longer life and more capacity.

An additive stabilizer which consists of triisopropanolamine and Monsanto Dequest has provided good results. Dequest is a 75% acid equivalent phosphate complex. The range by weight of the additive can be 0.1–10% by weight.

Good results have been obtained with a solution of:

30% by weight ammonium bifluoride
7% by weight hydrogen peroxide
3% by weight of stabilizer The stabilizer is in equal parts by weight of triisopropanol amine and Monsanto Dequest. It is believed a synergistic effect results from the use of both of these compounds together. Neither one alone provides the results of the combination, although, used separately, some improved results are obtained. It has been found that increasing the triisopropanolamine above 2.5% by weight inhibits the attack on solder, and Dequest above 3%–4% by weight reduces the rate of attack of the solution on solder.

Various soluble metal complexers have been tested and the results tabulated below. The lower numbers provided the best results from the standpoint of best looking copper, subsequent to the stripping process, and minimal attack on the copper and the board, as well as good stripping action. Thus No. 1 solution gave the best results, with No. 9 the worst. For a number of these examples the base remains the same — the only difference was the metal complexer or the absence of a metal complexer as in Examples Nos. 8 and 9. The common base is as follows:

| | | | |
|---|---|---|---|
| | | | 30% $NH_4F \cdot HF$ |
| | | | 20% $H_2O_2$(35%) |
| | | | 47% $H_2O$ |
| 1. | Base | + | 1.5% Dequest |
| | | | 1.5% triisopropanolamine |
| 2. | Base | + | 3% polyethylene imine |
| 3. | | | 40% $NH_4F \cdot HF$ |
| | | | 28.5% $H_2O_2$(35%) |
| | | | 1.5% Dequest |
| | | | 1.5% triisopropanolamine |
| | | | 28.5% $H_2O$ |

-continued

| | | | |
|---|---|---|---|
| 4. | Base | + | 3% quadrol |
| 5. | Base | + | 3% citric acid |
| 6. | Base | + | 3% triethylamine |
| 7. | Base | + | 3% gluconic acid |
| 8. | Base | + | 3% water |
| 9. | | | 15% $H_2O_2$ |
| | | | 40% $NH_4F$ . HF |

Although No. 3 provided a faster stripping rate than No. 1, the appearance of the copper was not as good as No. 1. However, if the metal complexer is increased in No. 3, the results are as good as the No. 1 solution.

The process by which the composition is utilized is illustrated in the flow chart of FIG. 7. The exposure of the solder and copper or plastic substrate is illustrated at step A where the solder is stripped from the substrate, typically within 0.5 to 3 minutes exposure time, depending upon temperature and the concentration of the hydrofluoric acid in the composition.

As applied to printed circuit boards, the stripping step is desirably performed by dipping the tab portion 16 of the circuit board 10 into an aqueous solution of the stripping composition. Thereafter the circuit board 10 is removed from the dip tank and is rinsed with tap water at room temperature at step B in the chart of FIG. 7. This clears the tab section of the stripping composition and dissolved solder.

Where the copper is substandard, such as poorly pyroplated copper, porous copper or low quality copper, it will have a stained or discolored appearance after the stripping operation. On such substandard copper the rinse step B may be followed with the subsequent step C of FIG. 7 of dipping the tab portion 16 of the circuit board 10 in a 10% aqueous solution of ammonium persulfate for a period of time ranging between 1 and 3 minutes. The next step is step D in which the ammonium persulfate is rinsed from the workpiece with tap water at room temperature.

The workpiece is then prepared for plating with a more noble metal by dipping the workpiece in a 10% aqueous solution of sulphuric acid for one minute as indicated at step E of FIG. 7 and thereafter rinsing the workpiece with tap water at room temperature as indicated at step F of FIG. 7. The workpiece is then rinsed with de-ionized or distilled water at room temperature at step G in FIG. 7 and is then plated at step H with a more noble metal such as gold, nickel or rhodium, as shown at 18 in FIG. 6.

Where the copper is of good quality, steps C and D may be eliminated.

With a solution of ammonium bifluoride and hydrogen peroxide in the preferred range as mentioned above, a differential etch rate is obtained in the reaction of the solder and copper of approximately 100 to 1. Thus the method effectively removes the solder with no appreciable destruction of the copper substrate.

I claim:

1. The method of rapidly stripping a layer of metal selected from the group consisting of lead-tin solder and tin from a layer of copper on a fiberglass circuit board without adversely affecting the copper and fiberglass, said process comprising the steps of exposing the solder to a composition comprising the ammonium bifluoride in the range of 10% to 25% by weight, hydrogen peroxide in the range of 1% to 5% by weight, and water in the range of 89% to 70% by weight for a time sufficient to remove the solder, and rinsing the said composition from the copper after the solder has been effectively stripped and before the copper and plastic have been adversely affected.

2. The method of claim 1 wherein the solder has a composition of 60 parts tin and 40 parts lead.

3. The method of claim 1 wherein the layer of copper includes terminal tab portions adapted for connection to an ancillary circuit.

4. The method of rapidly stripping a layer of metal selected from the group consisting of lead-tin solder and tin from a layer of copper on a plastic resin circuit board without adversely affecting the copper and board, said process comprising the steps of exposing the solder to a composition comprising ammonium bifluoride in the range of 5% to 50% by weight, hydrogen peroxide in the range of 1% to 35% by weight, a soluble metal complexer inhibitor of 0.1% to 10% by weight, and the balance of water for a time sufficient to remove the solder, and rinsing the said composition from the copper after the solder has been effectively stripped and before the copper and board have been adversely affected.

5. The method of claim 4 wherein the layer of copper includes terminal tab portions adapted for connection to an ancillary circuit.

6. The method of claim 4 wherein said metal complexer inhibitor comprises triisopropanolamine of 0.1% to 5.0% by weight and 0.1% to 5% by weight of a 75% acid equivalent phosphate complex.

7. The method of rapidly stripping a layer of metal selected from the group consisting of lead-tin solder and tin from a layer of copper on a plastic resin circuit board without adversely affecting the copper and board, said process comprising the steps of: exposing the solder to a composition comprising ammonium bifluoride in the range of 5% to 50% by weight, hydrogen peroxide in the range of 1% to 35% by weight and the balance of water for a time sufficient to remove the solder, and rinsing the said composition from the copper after the solder has been effectively stripped and before the copper and board have been adversely affected.

* * * * *